United States Patent [19]

Wedel, Jr.

[11] Patent Number: 4,667,298

[45] Date of Patent: May 19, 1987

[54] METHOD AND APPARATUS FOR FILTERING HIGH DATA RATE SIGNALS

[75] Inventor: John O. Wedel, Jr., Ellicott City, Md.

[73] Assignee: United States of America as Represented by the Secretary of the Army, Washington, D.C.

[21] Appl. No.: 559,565

[22] Filed: Dec. 8, 1983

[51] Int. Cl.$^4$ .............................................. G06J 1/00
[52] U.S. Cl. ................................... 364/602; 364/724; 364/325
[58] Field of Search ............... 364/600, 602, 715, 724, 364/807, 825; 333/18, 165–167

[56] References Cited

U.S. PATENT DOCUMENTS

| | | | |
|---|---|---|---|
| 3,521,170 | 7/1970 | Leuthold et al. | 364/602 X |
| 3,573,623 | 4/1971 | Bannon et al. | 364/602 X |
| 3,605,027 | 9/1971 | Nichols et al. | 328/145 |
| 3,949,206 | 4/1976 | Edwards et al. | 235/156 |
| 3,963,911 | 6/1976 | Franks | 333/18 X |
| 4,001,555 | 1/1977 | Levis et al. | 364/602 X |
| 4,120,035 | 10/1978 | Cases et al. | 364/602 |
| 4,121,295 | 10/1978 | Witt | 364/724 |
| 4,156,876 | 5/1979 | Debuisser | 333/166 X |
| 4,313,195 | 1/1982 | Lehmann | 370/84 |
| 4,322,810 | 3/1982 | Nakayama | 364/724 |
| 4,323,864 | 4/1982 | Ogawa et al. | 333/165 |
| 4,374,426 | 2/1983 | Burlage et al. | 364/724 |
| 4,435,823 | 3/1984 | Davis et al. | 364/724 X |

OTHER PUBLICATIONS

Schwartz, *Information Transmission, Modulation, and Noise*, McGraw-Hill Book Co. 1959, p. 146.
Lawson & Uhlenback, *Threshold Signals*, Boston Technical Publishers, Inc. 1964, p. 16.
Gregg, *Analog and Digital Communication*, John Wiley & Sons, Inc. 1977, p. 146–147.
Price, "A Useful Theorem for Nonlinear Devices Having Gaussian Inputs", *IRE Trans. Info. Theory*, IT-4$_{(2)}$ 69–72, (1958).
Watterson et al., "The Tricky System: A CFAR Scheme for Detecting the Presence of a Sine Wave in Gaussian Noise", Army Material Command Report 0077–8, Prepared by University of Florida, Jun. 28, 1968.
Crouse et al., "Transversal Filter with Analog-Digital Components", *IBM Technical Disclosure Bulletin*, vol. 11, No. 7, 1968, pp. 884–885.

*Primary Examiner*—Gary V. Harkcom
*Attorney, Agent, or Firm*—Saul Elbaum; Thomas E. McDonald; Alan J. Kennedy

[57] ABSTRACT

Method and apparatus for filtering high data rate signals, using a digital type filter, without requiring an analog-to-digital converter or the multiplicaton of digital signals. The incoming signal is wideband filtered and then hard limited to produce a constant amplitude signal having either a first or second instantaneous value. The constant amplitude signal is periodically sampled and stored in a multi-bit digital shift register as logic 1 or 0 signals. In one embodiment, the logic 1 or 0 signals stored in the shift register bits are periodically read out, multiplied by respective weighting constants, and summed to provide a filtered analog output signal. In another embodiment, the combination of logic 1 and 0 signals stored in the shift register are periodically sampled and used to address a memory, which outputs a digital signal which is the calculated value of weighted sum for that shift register combination.

14 Claims, 3 Drawing Figures

METHOD AND APPARATUS FOR FILTERING HIGH DATA RATE SIGNALS

RIGHTS OF THE GOVERNMENT

The invention described herein may be manufactured, used and licensed by or for the the U.S. Government for governmental purposes without payment to me of any royalty thereon.

BACKGROUND OF THE INVENTION

The invention relates to a method and apparatus for filtering an analog electrical signal utilizing a digital type filter.

The finite impulse response (FIR) filter is well known to the art. For example, a typical FIR filter can include a charge-coupled-delay having a number N of serially arranged registers for holding digital or analog signals. At a predetermined clocking rate, all the data held by the charged-coupled-delay is shifted to the next holding register as new data fills the first register and old data is lost from the Nth register. The output of each register is weighted and summed. The value of the weights determine the response of the filter stop band and the register length or delay time determines the filter bandwidth.

Charge-coupled-delay lines do not have the speed required for most filter applications. Therefore, digital circuits using TTL or COS/MOS circuits generally are used.

An FIR digital filter can be implemented using discrete digital circuits or a microprocessor. The conventional approach using a digital circuits or a microprocessor is to first convert the analog signal to a digital word by an analog-to-digital (A/D) converter. Each word is stored, weighted, and summed in the processor to form the FIR filter. Since multiplications are required to provide weights for the stored numbers, many milliseconds of computer time are required. Depending on the filter specification, there may be more time efficient filters which can be implemented than an FIR filter, but any known filter requires complex addition or multiplication. Typical examples of such known digital filtering devices are described in U.S. Pat. No. 3,949,206, issued Apr. 6, 1976 to Edwards et al U.S. Pat. No. 4,120,035 issued Oct. 10, 1978 to Cases et al, U.S. Pat. No. 4,313,195, issued Jan. 6, 1982 to Lehmann, and U.S. Pat. No. 4,322,810, issued Mar. 3, 1982 to Nakayama.

Until the present invention, microprocessors have not been used in systems to provide filtering where the system data rates are high, in the order of several tens of microseconds, since known algorithms used to form a digital filter requires one or more multiplications, each requiring milliseconds of computational time, during which the computer cannot be used to process other data.

Also, a CFAR (Constant False Alarm Rate) scheme for detecting the presence of a sine wave in Gaussian noise, known as the Tricky system, is known to the art. In this system, the received signal is wideband filtered, and is then hard limited to provide a constant amplitude signal having either a first or a second instantaneous value. This hard limited signal is then filtered through a narrow band analog filter, and integrated to provide the desired output signal. This system is described in detail in a University of Florida report #0007-8, dated June 28, 1968, by Watterson, Dickson, and Johnson, entitled "The Tricky System: A CFAR scheme for detecting the presence of a sine wave in Gaussian noise".

SUMMARY OF THE INVENTION

Therefore, it is an object of the invention to provide a method and apparatus for the digital filtering of high data signals which does not require an A/D converter.

It is a further object of the invention to provide such a digital filtering method and apparatus, in which the algorithm used for filtering requires no time consuming digital signal multiplications. In the method and apparatus for filtering high data rate signals, according to the invention, the incoming signal is processed to convert this signal into a constant amplitude alternating signal having either a first or second instantaneous valve (logic 1 or 0). The incoming signal is first broadband filtered, and then is hard limited in a known limiter circuit similar to the limiter circuit utilized in the Tricky system described above or in conventional frequency modulated (FM) receivers. This limiter output signal, consisting of either logic 1's or 0's, is periodically sampled, held and narrowband filtered. Since the output of the sample/hold circuit is a 1 or 0, an A/D converter is not required. Also, since each stored signal is also either a 1 or 0 rather than a digitally encoded value such as required in prior known filtering methods and apparatus, the 1's and 0's can be stored in a simple digital shift register, rather than in a charged-coupled-delay lines or a delay chain of shift registers in parallel to process the bits from a A/D converter. The constant amplitude signal is periodically sampled and stored in the first bit of a multi-bit shift register, the signal in each bit being shifted to a subsequent bit as a new signal is stored in the first bit and the signal stored in the last bit is lost. Each combination of 1's and 0's stored in the shift register is then processed to generate an output signal coresponding to calculated values of weighted sum for the shift register combinations.

In one embodiment of the invention, the stored signal present at each bit of the shift register is supplies to a conventional summing circuit through respective weighting resistors, and the weighted summed signal is then detected and integrated or filtered to produce the output signal of the filtering system.

In another embodiment of the invention, each combination of 1's and 0's stored in the shift register is used as an address for a memory, to read out of the memory a number which is the calculated value of the weighted sum for that shift register combination. This memory contains a plurality of numbers corresponding respectively to all possible shift register combinations. These are read out of the shift register as a digital signal, which then can be either further processed in the microprocessor or can be converted to an analog signal by a conventional A/D converter.

BRIEF DESCRIPTION OF THE DRAWINGS

The invention will be better understood, and further objects, features, and advantages thereof will become more apparent from the following description of preferred embodiments, taken in conjunction with the accompanying drawings in which.

DESCRIPTION OF A PREFERRED EMBODIMENT

Figure 1:
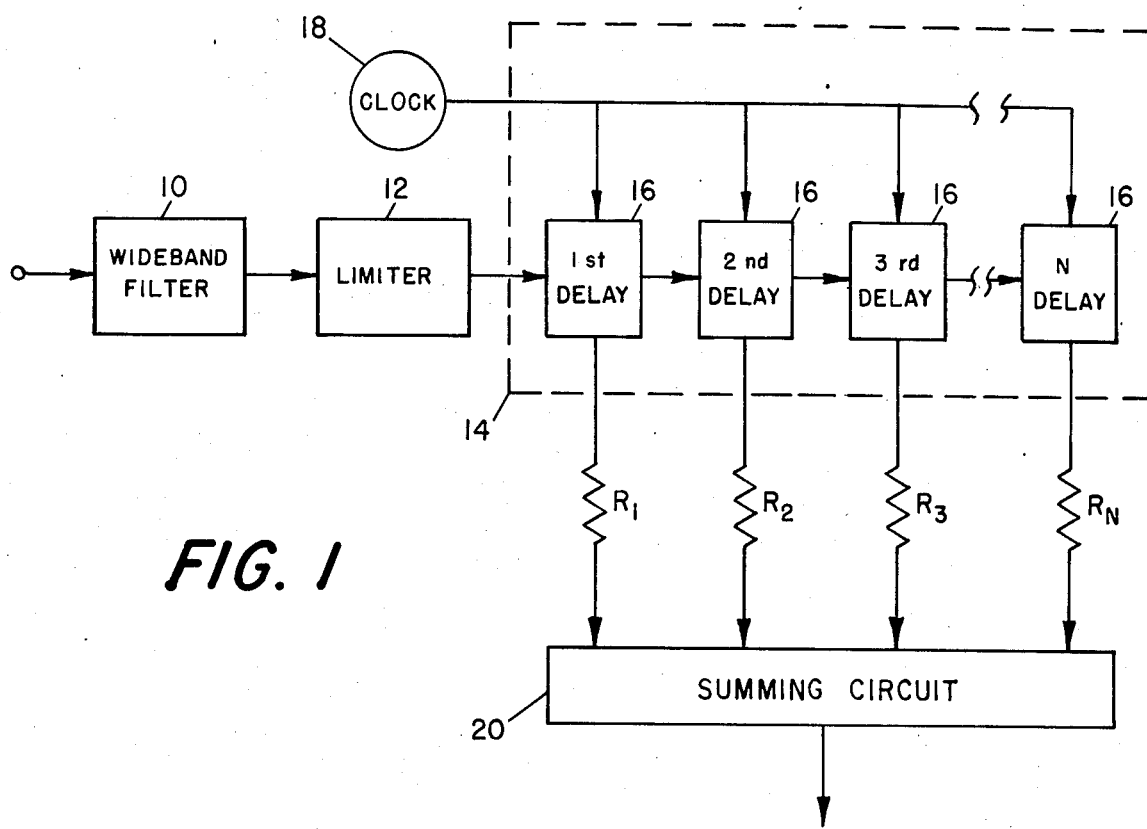
FIG. 1 is a block diagram of a first embodiment of the invention.

In the embodiment shown in FIG. 1, a high data rate signal to be filtered is first wideband filtered in a conventional wideband filter 10, and then is hard limited in a limiter circuit 12 similar to limiter circuits used in the above-described Tricky system or in conventional frequency modulated (FM) receivers. The output signal of the limiter 12 is a constant amplitude signal having either a first or a second instantaneous value. Since only two levels are present in the output signal of the limiter 12, this signal is periodically sampled and stored as a logic 0 or 1 signal in a first delay element or bit of a digital shift register 14 having N storage bits 16 at a sampling rate determined by a clock circuit 18. During each sampling operation, the logic 0 or 1 signal in each bit is shifted to a subsequent bit as a new logic 1 or 0 signal as stored in the first bit and the logic signal in the last bit is lost. The logic 0 or 1 signals stored in the bits 16 are periodically read out, multiplied by respective weighting constants, and summed in a summing circuit 20 to provide an analog output signal of the FIR filter. In the embodiment of FIG. 1, this multiplication or weighting of the sampled bit signals is accomplished by supplying the sampled bit signals to the summing circuit 20 through respective weighting resistors $R_1, R_2, R_3, \ldots R_N$.

Conventional digital shift registers, in which each bit has an output at which the signal stored in the bit can be sampled without changing the stored signal, can be used for the shift register 14. For example, four RCA type CD4015A COS/MOS dual 4 stage static shift registers can be connected in series to form a 16-bit digital shift register 14.

Conventional summing circuits may be used for the summing circuit 20. For example, summing circuits utilizing operational amplifiers, such as described in U.S. Pat. No. 3,605,027 to Nichols et al, may be used for the summing circuit 20. Also, the summing circuit 20 may comprises several summing circuits in cascade. For example, in a 16-bit FIR filter, the logic 1 and 0 signals stored in the first 8 bits may be periodically read out and supplied to a first summing circuit through respective weighting resistors, while the logic 1 and 0 signals stored in the remaining 8 bits are also read out and supplied to a second summing circuit through respective weighting resistors. The analog output signals of the first and second summing circuits are then supplied to a third summing circuit, which produces the analog output signal of the FIR filter.

In the embodiment of FIG. 1, the value of the weighting resistors determines the response of the filter stop band, and the register length or delay time determines the filter bandwidth. For example, both lowpass and bandpass digital filters, using a 16-bit FIR filter, have been tested in the circuit of FIG. 1. The three dB bandwidth of these filters, when operated at a 20 KHz data rate, measures 3.75 and 7.5 KHz for the lowpass and bandpass, respectively, and the out-of-band attenuation exceeds 40 dB.

Figure 2:
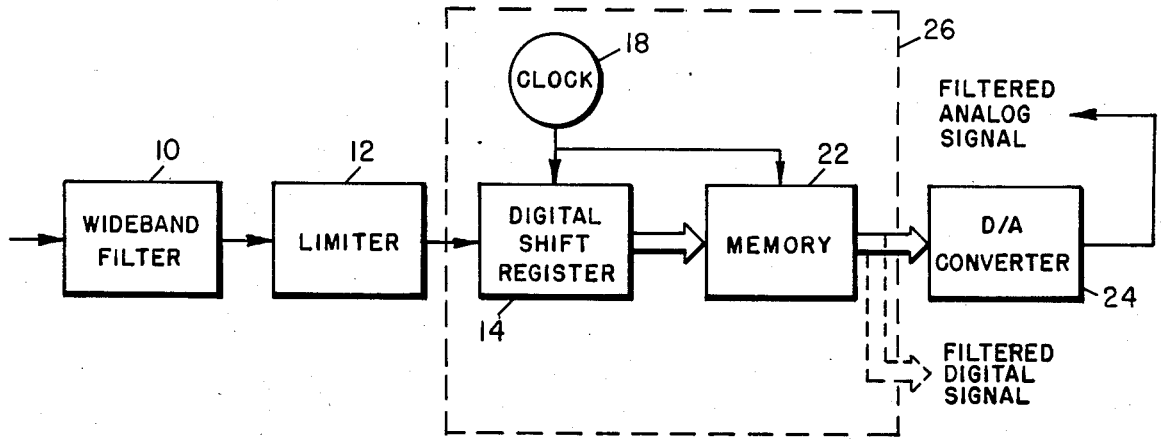
FIG. 2 is a block diagram of a second embodiment of the invention.

The embodiment shown in FIG. 2 includes the same arrangement of a wideband filter 10, a limiter 12, and a digital shift register 14 as that of the embodiment of FIG. 1. However, in the embodiment of FIG. 2, the combination of logic 1 and 0 signals stored in the N bits of the digital shift register 14 is periodically sampled at a rate determined by the clocking circuit 18, and this shift register combination is used to address a memory unit 22, to read out of the memory unit 22 a number which is a calculated value of weighted sum for that particular shift register combination. The memory 22 has stored therein a plurality of numbers corresponding respectively to all possible combinations of logic 1 and 0 signals stored in the digital shift register 14, each stored number being a calculated value of weighted sum for the corresponding shift register combination. Thus, if the digital shift register 14 is an eight bit register, the memory 22 must contain a number corresponding to any one of $2^8$ or 256 different combinations of logic 1 and 0 signals. The 256 calculated values for the desired filter response are stored in the memory 22, and are addressed in memory by the received 8-bit word stored in the data register during each clocking operation. The numbers are read out of the memory 22 as digital signals or words which are converted to an analog signal by a digital-to-analog converter 24. Alternately, the numbers read out of the memory 22 can be further processed as digital signals.

The memory unit 22, the digital shift register 14, and the clocking circuit 18 can be separate component elements or component elements of a conventional computer or microprocessor 26, such as the Motorola 68000 or the Motorola 6809.

Figure 3:
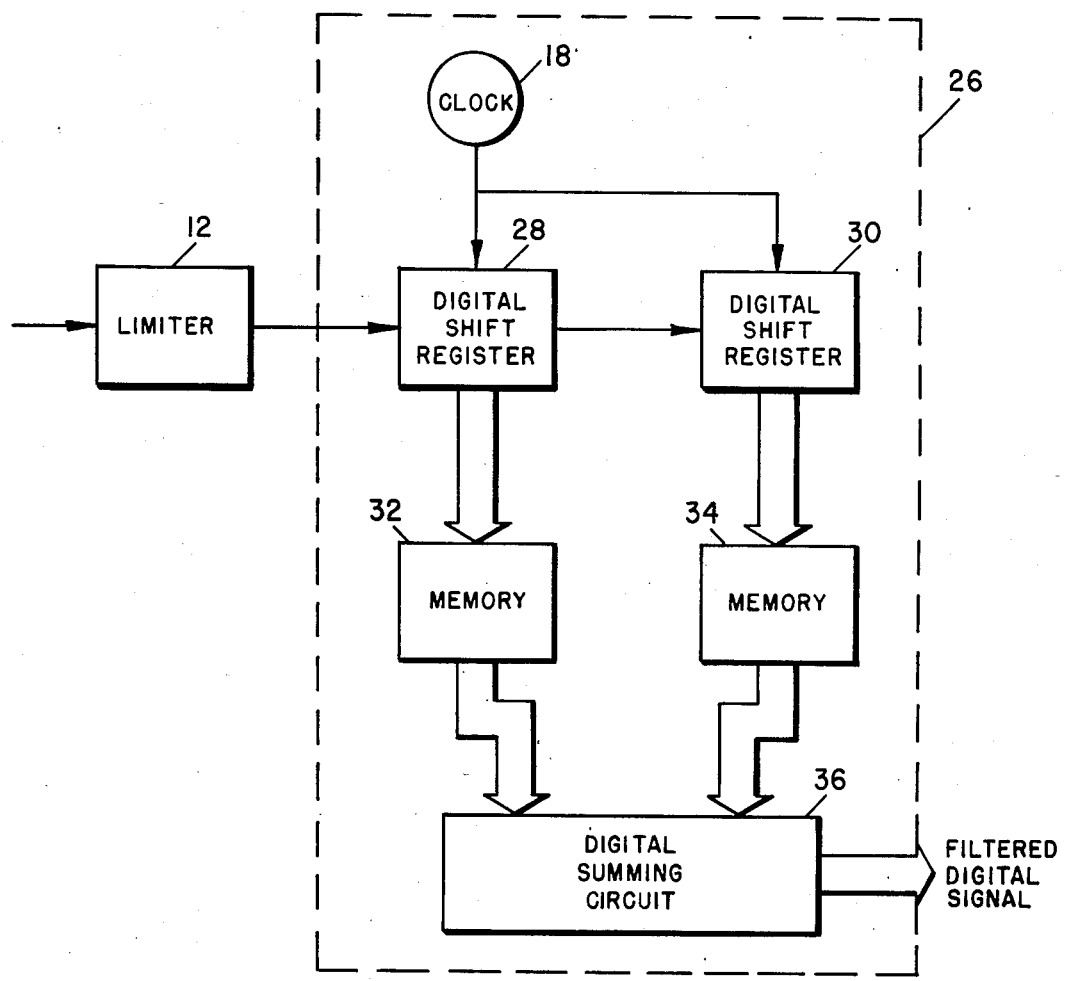
FIG. 3 is a block diagram showing a modification of the embodiment of FIG. 2.

For a filter requiring a large number of delay elements, an equivalent filter circuit such as shown in FIG. 3 can be used in place of the digital shift register 14 and memory 22 of FIG. 2 to reduce the amount of memory required. For example, if a filter requires 16 delay elements, then $2^{16}$ or 65,536 memory locations are required in the memory 22. However, in the circuit of FIG. 3, the signal from the limiter 12 is supplied to two serially arranged, eight bit digital shift registers, 28 and 30. During each clocking operation, the combination of logic 1 and 0 signals stored in the digital shift register 28 is sampled and this eight-bit combination is used to address a memory 32 and read out of the memory 32 a number which is the calculated value of weighted sum for that particular shift register combination. Similarly, during each clocking operation, the combination of logic 1 and 0 signals stored in the digital shift register 30 is sampled and used to address a second memory 34, to read out of the memory 34 a number which is the calculated value of weighted sum for the sample combination of the shift register 30. The numbers which are read of the memories 32 and 34 as digital signals are supplied to the summing circuit 36, which produces the filtered output signal in digital form. This digital output signal can then be converted to an analog signal by a conventional D/A converter 34, as described above. Thus, by using the equivalent filter circuit showing in FIG. 3 rather than that shown in FIG. 2, the number of memory locations required is reduced from 65,536 to $2 \times 256$, or 512. Using a commercially available microprocessor, namely, the Motorola 68000 microprocessor with a 4 MHz clock, the number of clock cycles required to form the 16 delay line filter represented by FIG. 3 is 33 or 8.25 microseconds.

Since various modifications, variations, and additions to the invention are possible int he spirit of the invention in existence to the specific embodiments described herein, is intended that the scope with the invention be limited only by the appended claims.

What is claimed and desired to be secured by Letters Patent of the United States is:

1. Apparatus for filtering an analog signal, comprising:
   signal limiting means for hard limiting said analog signal to provide a constant amplitude signal having a first instantaneous value when the analog signal is above a predetermined level, and having a second instantaneous value when the analog signal is below said predetermined level, to thus remove amplitude fluctuations of said analog signal;
   clock means for generating timing signals;
   digital shift register means, actuated by said clock means and including a plurality of serially-arranged storage bits, for periodically sampling and storing said constant amplitude signal in a first bit as a logic 1 signal when the sampled constant amplitude signal has said first instantaneous value and as a logic 0 signal when the sampled constant amplitude signal has said second instantenous value, the signal in each bit being shifted to a subsequent bit as a new signal is stored in the first bit and the signal stored in the last bit is lost, each bit having an output at which the signal stored in the bit can be sampled without changing the stored signal; and
   signal processing means for sampling each combination of logic 1 and 0 signals stored in said shift register means, and generating an output signal corresponding to calculated values of weighted sum for said shift register combinations.

2. Apparatus, as described in claim 1, in which said signal processing means comprise:
   signal summing means, having a plurality of inputs corresponding to the plurality of shift register bits, for generating an output signal which is the sum of signals supplied to said inputs; and
   a plurality of weighting resistors connected between the bit outputs and the summing means inputs, respectively.

3. Apparatus, as described in claim 1, in which said signal processing means comprises:
   memory means, having stored therein a plurality of numbers corresponding respectively to all possible combinations of logic 1 and 0 signals stored in said shift register means, each stored number being a calculated value of weighted sum for the corresponding shift register combination, said memory means being periodically activated by said clock means to sample each shift register combination and read out of said memory means the number corresponding to said sampled shift register combination.

4. Apparatus, as described in claim 3, which further comprises signal converting means for converting said number read out of said memory means to an analog signal.

5. Apparatus, as described in claim 1, in which said signal processing means comprise:
   a plurality of memory means, associated respectively with selected portions of the shift register bits, said bit portions together including all of the shift register bits, each memory means having stored therin a plurality of numbers corresponding respectively to all possible combinations of logic 1 and 0 signals stored in the associated portion of said shift register bits, each stored number being a calculated value of weighted sum for the corresponding combination stored in the associated bit portion, each memory means being periodically activated by said clock means to sample each combinations stored in the associated bit portion, each memory means being periodically activated by said clock means to sample each combination stored in the associated bit portion and read out of said memory means the number corresponding to said sampled combination; and
   summing means for summing the numbers read out of said plurality of memory means during each shift register combination sampling period.

6. Apparatus, as described in claim 5, which further comprises signal converting means for converting the summed numbers produced by said summing means to an analog signal.

7. Apparatus, as described in claim 1, in which said signal limiting means comprises:
   a filter circuit for wideband filtering said analog signal; and
   a limiter circuit for hard limiting the wideband filtered analog signal.

8. An analog signal filtering method, comprising the steps of:
   hard limiting said analog signal to provide a constant amplitude signal having a first instantaneous value when the analog signal is above a predetermined level, and having a second instantaneous value when the analog signal is below said predetermined level, to thus remove amplitude fluctuations of said analog signal;
   periodically sampling said constant amplitude signal;
   storing each sampled constant amplitude signal in a first bit of a multi-bit digital shift register as a logic 1 signal when the sampled constant amplitude signal has said first instantaneous value and as a logic 0 signal when the sampled constant amplitude signal has said second instantaneous value, the signal in each bit being shifted to a subsequent bit as a new signal is stored in the first bit and the signal in the last bit is lost;
   periodically sampling, without altering or destroying, the combination of logic 1 and 0 signals stored in said shift register bits; and
   converting said sampled shift register combinations into an output signal corresponding to calculated values of weighted sum for said shift register combinations.

9. A method, as described in claim 8, wherein the step of converting said sampled shift register combinations further comprises the steps of:
   multiplying the sampled bit signals of each sampled shift register combination by respective weighting values; and
   summing the weighted bit signals of each sampled shift register combination to produce said output signal.

10. A method, as described in claim 8, wherein the step of converting said sampled shift register combinations further comprises the step of:
   using each sampled shift register combination as the address for a memory means having stored therein a plurality of numbers corresponding respectively to all possible shift register combinations, each stored number being a calculated value of weighted sum for the corresponding shift register combination, to thus read out of the memory means numbers corresponding to said sampled shift register combination in the form of digital signals constituting said output signal.

11. A method, as described in claim 10, which further comprises the step of converting the digital output signal of said memory means to an analog output signal.

12. A method, as described in claim 8, wherein the step of converting said sampled shift register combinations further comprises the steps of:

using portins of each sampled shift register combination of logic 1 and 0 signals stored in the shift register bits as respective addresses for a plurality of memory means, each memory means having stored therein a plurality of numbers corresponding respectively to all possible combinatins of logic 1 and 0 signals stored in an associated portion of the shift register bits, each stored number being a calculated value of weighted sum for the corresponding combination of logic 1 and 0 signals stored in the associated portion of the shift register bits, to thus read out of said memory means numbers corresponding to respective portions of each sampled shift register combination in the form of digital signals; and summing the numbers read out of said plurality of memory means during each shift register combination sampling period, to produce said output signal.

13. A method, as described in claim 12, which further comprises the step of converting said output signal from a digital signal into an analog signal.

14. A method, as described in claim 8, which, before the step of hard limiting said analog signal, further comprises the step of wideband filtering said analog signal.

* * * * *